US011758655B2

(12) United States Patent
Lee et al.

(10) Patent No.: US 11,758,655 B2
(45) Date of Patent: Sep. 12, 2023

(54) PRINTED CIRCUIT BOARD

(71) Applicant: SAMSUNG ELECTRO-MECHANICS CO., LTD., Suwon-si (KR)

(72) Inventors: Seung Eun Lee, Suwon-si (KR); Jae Woong Choi, Suwon-si (KR); Joo Hwan Jung, Suwon-si (KR); Yong Hoon Kim, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/215,916

(22) Filed: Mar. 29, 2021

(65) Prior Publication Data

US 2021/0410285 A1 Dec. 30, 2021

(30) Foreign Application Priority Data

Jun. 30, 2020 (KR) .......................... 10-2020-0079852

(51) Int. Cl.
*H05K 1/11* (2006.01)
*H05K 1/18* (2006.01)
*H05K 1/02* (2006.01)
*H05K 1/03* (2006.01)

(52) U.S. Cl.
CPC .......... *H05K 1/115* (2013.01); *H05K 1/0298* (2013.01); *H05K 1/111* (2013.01); *H05K 1/183* (2013.01); *H05K 1/184* (2013.01); *H05K 1/185* (2013.01); *H05K 1/0366* (2013.01); *H05K 1/181* (2013.01)

(58) Field of Classification Search
CPC ........ H05K 1/115; H05K 1/184; H05K 1/116; H05K 3/0097; H05K 3/4644; H05K 2203/1536; H05K 1/185; H05K 1/0298; H05K 1/181; H05K 1/0366; H05K 1/0373; H05K 3/4697; H01L 23/12
See application file for complete search history.

(56) References Cited

U.S. PATENT DOCUMENTS

| 6,724,638 | B1 | 4/2004 | Inagaki et al. | |
| 8,829,357 | B2 * | 9/2014 | Mikado | H05K 3/4602 |
| | | | | 174/262 |
| 9,307,632 | B2 * | 4/2016 | Lee | H05K 1/0271 |
| 9,313,893 | B2 * | 4/2016 | Lee | H05K 1/185 |

(Continued)

FOREIGN PATENT DOCUMENTS

| KR | 10-2010-0080633 A | 7/2010 |
| KR | 10-2016-0019297 A | 2/2016 |
| KR | 10-1726568 B1 | 4/2017 |

*Primary Examiner* — Ishwarbhai B Patel
(74) *Attorney, Agent, or Firm* — Morgan, Lewis & Bockius LLP

(57) ABSTRACT

A printed circuit board includes a first insulating layer, a second insulating layer disposed on a lower surface of the first insulating layer, an electronic component embedded in the second insulating layer and at least partially in contact with the first insulating layer, a first wiring layer disposed on an upper surface of the first insulating layer, a second wiring layer disposed on a lower surface of the second insulating layer, and a first wiring via penetrating through the first and second insulating layers and connecting at least portions of the first and second wiring layers to each other.

15 Claims, 9 Drawing Sheets

(56) References Cited

U.S. PATENT DOCUMENTS

| | | | | |
|---|---|---|---|---|
| 9,883,579 | B1* | 1/2018 | Huang | H05K 3/30 |
| 9,961,785 | B2* | 5/2018 | Sato | H05K 3/4697 |
| 2010/0300602 | A1* | 12/2010 | Ichiyanagi | H01L 23/50 |
| | | | | 156/89.12 |
| 2011/0155433 | A1* | 6/2011 | Funaya | H01L 23/49827 |
| | | | | 174/258 |
| 2012/0186866 | A1* | 7/2012 | Mikado | H05K 3/4602 |
| | | | | 29/832 |
| 2014/0104797 | A1* | 4/2014 | Machida | H05K 1/185 |
| | | | | 361/760 |
| 2014/0185258 | A1* | 7/2014 | Lee | H01L 23/49822 |
| | | | | 361/761 |
| 2014/0293559 | A1* | 10/2014 | Suzuki | H05K 1/185 |
| | | | | 361/761 |
| 2016/0044788 | A1 | 2/2016 | Park et al. | |
| 2016/0113114 | A1* | 4/2016 | Chan | H05K 3/0097 |
| | | | | 174/251 |
| 2017/0243841 | A1 | 8/2017 | Ko et al. | |

\* cited by examiner

PRINTED CIRCUIT BOARD

CROSS-REFERENCE TO RELATED APPLICATION(S)

This application claims the benefit under 35 USC 119(a) of Korean Patent Application No. 10-2020-0079852 filed on Jun. 30, 2020 in the Korean Intellectual Property Office, the entire disclosure of which is incorporated herein by reference for all purposes.

TECHNICAL FIELD

The present disclosure relates to a printed circuit board that may be used as, for example, a package substrate for mounting a semiconductor chip.

BACKGROUND

With the rapid increase in the number of input-output (I/O) and integration in accordance with the high performance of electronic products, there is a demand for highly multilayer and large-sized technology on the substrate. For example, an increase in the size and number of layers of a Flip Chip Ball Grid Array (FCBGA) substrate for a high-performance semiconductor is required, and there may be a problem of an increase in costs due to an increase in technical difficulty and a decrease in yield. Accordingly, there is a need for a technology capable of reducing costs while maintaining the performance of the substrate. In addition, power integrity is also emerging as important characteristics as electronic products become more high-performance.

SUMMARY

Exemplary embodiments provide a printed circuit board, which may be more easily implemented with multiple layers, and in which an electronic component may be embedded.

Another embodiment provides a printed circuit board in which power integrity characteristics may be improved.

According to an exemplary embodiment, an electronic component may be embedded in an outer side, and a multilayer circuit may be implemented, by utilizing a coreless structure.

According to an exemplary embodiment, a printed circuit board includes a first insulating layer, a second insulating layer disposed on a lower surface of the first insulating layer, an electronic component embedded in the second insulating layer and at least partially in contact with the first insulating layer, a first wiring layer disposed on an upper surface of the first insulating layer, a second wiring layer disposed on a lower surface of the second insulating layer, and a first wiring via penetrating through the first and second insulating layers and connecting at least portions of the first and second wiring layers to each other.

According to an exemplary embodiment, a printed circuit board includes an insulating body including a plurality of insulating layers, a plurality of wiring layers respectively disposed on or in the insulating body, a plurality of wiring via layers respectively disposed in the insulating body, and connecting the plurality of wiring layers to each other, and an electronic component disposed in the insulating body and disposed on a level between two adjacent wiring layers among the plurality of wiring layers. One wiring via layer connecting the two adjacent wiring layers, among the plurality of wiring via layers, penetrates through at least two insulating layers among the plurality of insulating layers.

According to an exemplary embodiment, a printed circuit board includes a plurality of insulating layers, an electronic component disposed on an interface between two adjacent insulating layers among the plurality of insulating layers, and a plurality of wiring layers respectively disposed on or embedded in the plurality of insulating layers. Each of the plurality of wiring layers is spaced apart from the interface.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
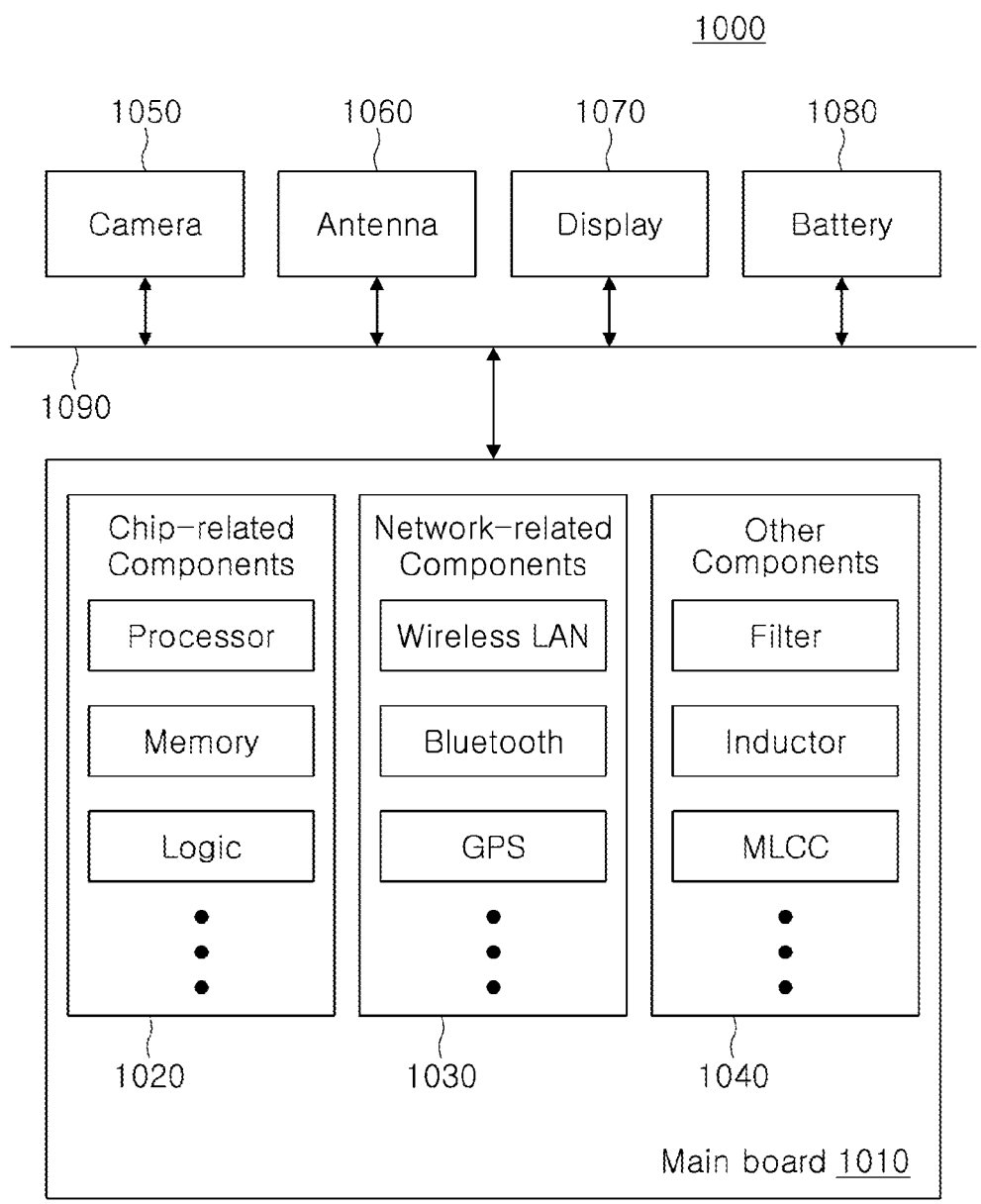
FIG. 1 is a block diagram schematically illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Hereinafter, embodiments will be described with reference to the accompanying drawings. In the drawings, the shapes and sizes of elements may be exaggerated or reduced for clearer explanation.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but in addition to these chip related components, may also include other types of chip related components. In addition, the chip related components 1020 may be combined with each other. The chip-related components 1020 may also be in the form of a package including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with the chip-related components 1020 and provided in a package form.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive devices in the form of chip components used for various other purposes, or the like. In addition, other components 1040 may be combined with the chip-related components 1020 and/or the network-related components 1030 and may be provided in a package form.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, or the like. However, these other electronic components are not limited thereto, but may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, the electronic device 1000 may also include other electronic components used for various purposes depending on a type of the electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
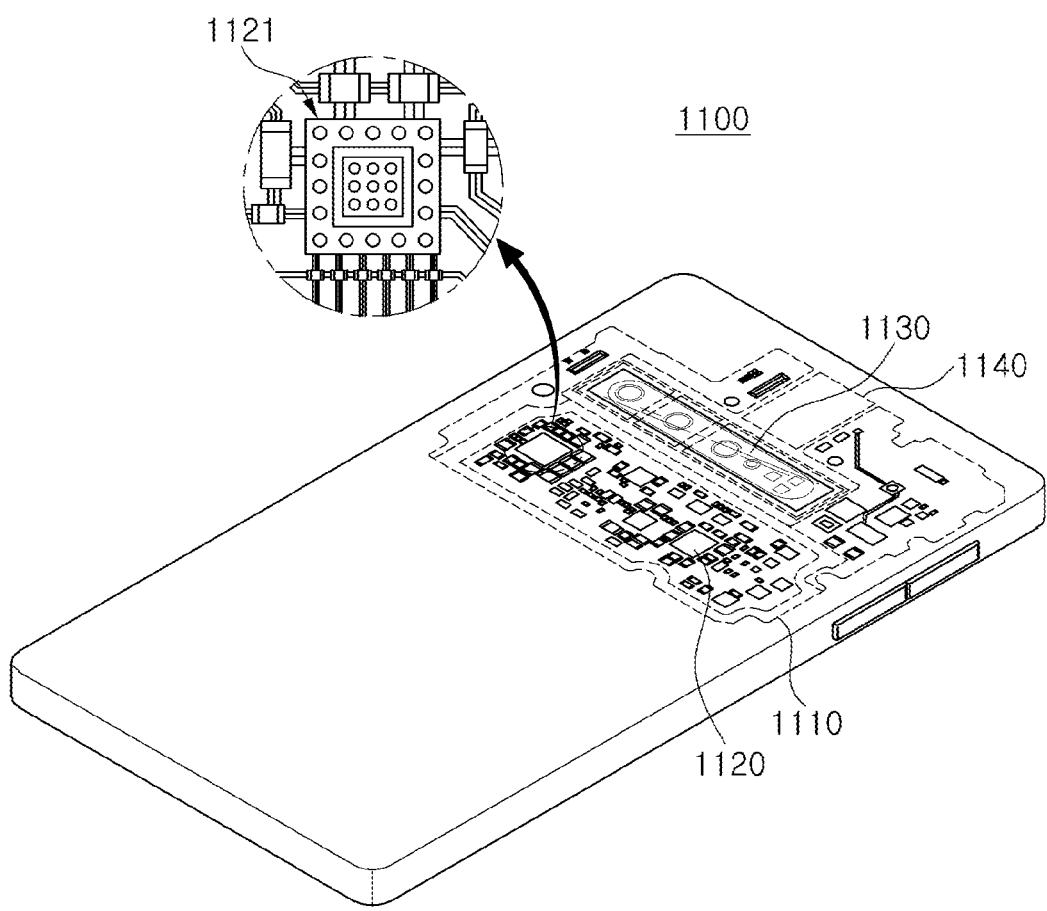
FIG. 2 is a perspective view schematically illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various components 1120 may be physically and/or electrically connected to the motherboard 1110. In addition, a camera module 1130 and/or a speaker 1140, and the like, may be accommodated in the smartphone 1100. Some of the components 1120 may be the chip related components, for example, a semiconductor package 1121, but are not limited thereto. The semiconductor package 1121 may be a package form in which a semiconductor chip is disposed on a multilayer printed circuit board in the form of surface mounting, but is not limited thereto. The electronic device is not necessarily limited to the smartphone 1100, but may be other electronic devices as described above.

Figure 3:
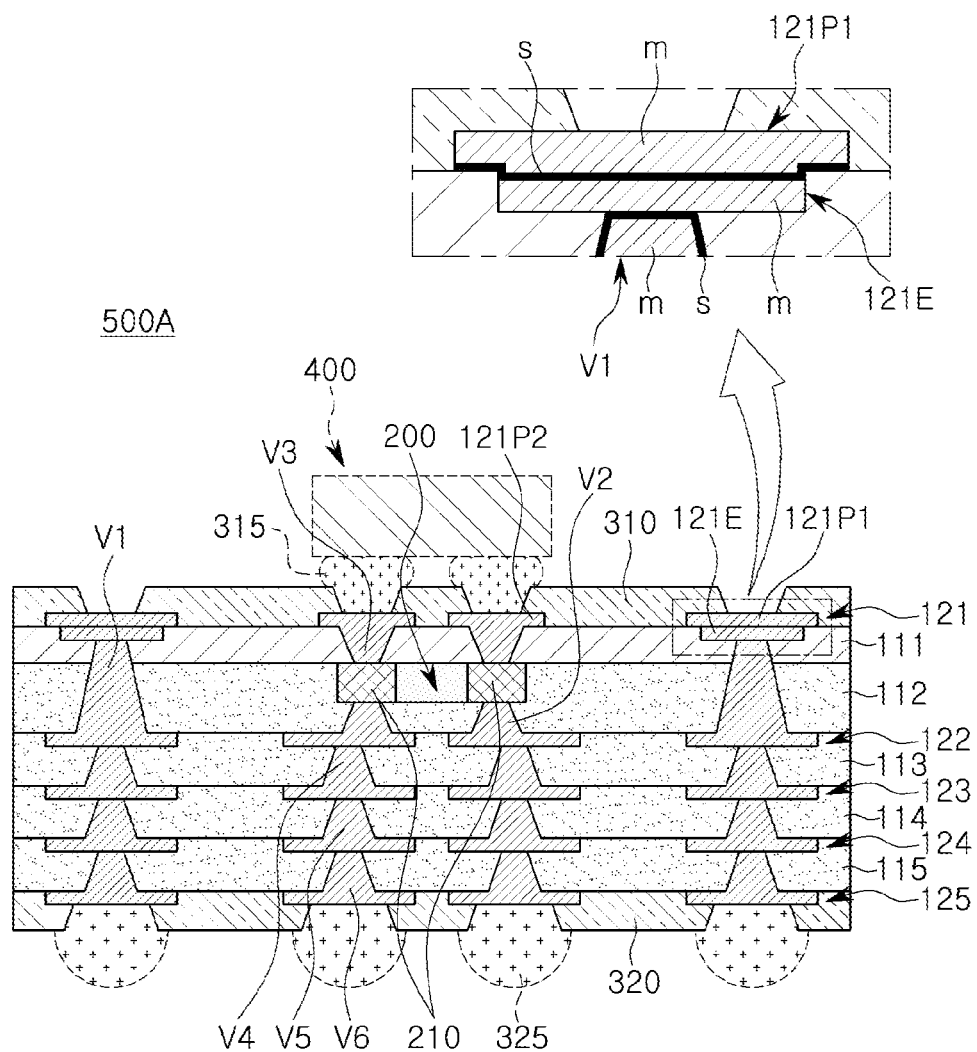
FIG. 3 is a schematic cross-sectional view of an example of a printed circuit board.

FIG. 3 is a schematic cross-sectional view illustrating an example of a printed circuit board.

Referring to FIG. 3, a printed circuit board 500A according to an example includes a plurality of insulating layers 111, 112, 113, 114 and 115, a plurality of wiring layers 121, 122, 123, 124 and 125, and a plurality of wiring via layers V1, V2, V3, V4, V5 and V6, and an electronic component 200 embedded in one or more among the plurality of insulating layers 111, 112, 113, 114 and 115. The plurality of insulating layers 111, 112, 113, 114 and 115 provide an insulating body. If necessary, the printed circuit board 500A may further include first and second passivation layers 310 and 320 disposed on upper and lower sides of the insulating body, respectively, first and second electrical connection metals 315 and 325 disposed in openings of the first and second passivation layers 310 and 320, respectively, and/or a semiconductor chip 400 surface-mounted on the first passivation layer 310.

In more detail, the printed circuit board 500A according to an embodiment includes a first insulating layer 111, a second insulating layer 112 disposed on a lower surface of the first insulating layer, an electronic component 200 embedded inside the second insulating layer 112 and at least partially in contact with the first insulating layer 111, a first wiring layer 121 disposed adjacent to an upper surface of the first insulating layer 111, a second wiring layer 122 disposed on a lower surface of the second insulating layer 112, a first wiring via V1 penetrating through the first and second insulating layers 111 and 112 at once and connecting at least portions of the first and second wiring layers 121 and 122 to each other, a second wiring via V2 penetrating through the second insulating layer 112 and connecting at least portions of the electronic component 200 and the second wiring layer 122 to each other, a third wiring via V3 penetrating through the first insulating layer 111 and connecting at least portions of the electronic component 200 and the first wiring layer 121 to each other, a third insulating layer 113 disposed on a lower surface of the second insulating layer 112, a third wiring layer 123 disposed on a lower surface of the third insulating layer 113, a fourth wiring via V4 penetrating through the third insulating layer 113 and connecting at least portions of the second and third wiring layers 122 and 123 to each other, a fourth insulating layer 114 disposed on a lower surface of the third insulating layer 113, a fourth wiring layer 124 disposed on a lower surface of the fourth insulating layer 114, a fifth wiring via V5 penetrating through the fourth insulating layer 114 and connecting at least portions of the third and fourth wiring layers 123 and 124 to each other, a fifth insulating layer 115 disposed on a lower surface of the fourth insulating layer 114, a fifth wiring layer 125 disposed on a lower surface of the fifth insulating layer 115, and a sixth wiring via V6 penetrating through the fifth insulating layer 115 and connecting at least portions of the fourth and fifth wiring layers 124 and 125 to each other.

If necessary, the printed circuit board 500A according to an example may further include a first passivation layer 310 disposed on the first insulating layer 111 and having a first opening exposing at least a portion of the first wiring layer 121, a second passivation layer 320 disposed on the fifth insulating layer 115 and having a second opening exposing at least a portion of the fifth wiring layer 125, a first electrical connection metal 315 disposed on the first opening of the first passivation layer 310 and electrically connected to the first wiring layer 121, a second electrical connection metal 325 disposed on the second opening of the second passivation layer 320 and electrically connected to the fifth wiring layer 125, and/or a semiconductor chip 400 disposed on the first passivation layer 310 and electrically connected to the electronic component 200.

On the other hand, as described above, in the case of a printed circuit board, an increase in size and an increase in the number of layers are required, and power integrity is also emerging as an important characteristic as high performance of electronic products is improved. To this end, an FCBGA substrate, in which a passive component is embedded in a relatively thick core and a multilayer circuit is implemented on both sides of the core through a build-up process, may be considered. However, the FCBGA substrate having such a structure may cause a problem of an increase in cost due to an increase in technical difficulty and a decrease in yield. In addition, as the multilayer circuit is implemented through the build-up process, the distance between the passive component embedded in the core and the semiconductor chip surface-mounted on the substrate may increase, and thus, there may be limitations in improving power integrity characteristics.

Meanwhile, the printed circuit board 500A according to an example does not embed the electronic component 200 in a thick core, but uses a coreless structure to embed the electronic component 200 therein, and the plurality of wiring layers 121, 122, 123, 124 and 125 are formed by a build-up process. Accordingly, a multilayer board in which an electronic component is more easily embedded may be provided. In addition, the printed circuit board 500A according to an example uses a coreless structure to embed the electronic component 200 in an outer side on which the semiconductor chip 400 is surface mounted. For example, the electronic component 200 is disposed in an asymmetrical shape in the board. In this case, regardless of increasing the number of the wiring layers 121, 122, 123, 124 and 125 through the build-up process, the distance between the electronic component 200 and the semiconductor chip 400 may be significantly reduced. Therefore, the power integrity characteristics may be improved.

In addition, in the case of the printed circuit board 500A according to an example, at least portions of the first and second wiring layers 121 and 122 are connected to each other through the first wiring via V1 penetrating through the first and second insulating layers 111 and 112 at once which are multiple layers. In this case, forming a pad pattern for connecting wiring vias of different layers at the boundary between the first and second insulating layers 111 and 112 may be omitted. Therefore, the process may be simplified further, and as a result, a multilayer board with electronic components more easily embedded therein may be provided.

The first insulating layer 111 may include a different type of material from a material of the second insulating layer 112, and may also include a different type of material from the third to fifth insulating layers 113, 114 and 115. The first insulating layer 111 is used as an adhesive layer as in the process to be described later. As the material of the first insulating layer 111, a material including an insulating resin and an inorganic filler without glass fibers, for example, Ajinomoto Build-up Film (ABF) may be used. The second to fifth insulating layers 112, 113, 114 and 115 are used as a build-up layer as in the process to be described later, and as the material thereof, a material including an insulating resin, an inorganic filler and glass fiber, for example, a prepreg may be used. In this respect, the thickness of the first insulating layer 111 may be relatively thinner than the thickness of each of the second to fifth insulating layers 112, 113, 114 and 115. The electronic component 200 is embedded in the second insulating layer 112, and thus, the second insulating layer 112 may be thicker than the other insulating layers 111, 113, 114 and 115. In one example, the electronic component 200 may be disposed on an interface between the second insulating layer 112 and the first insulating layer 111, and the plurality of wiring layers 121, 122, 123, 124 and 125 may be spaced apart from the interface.

On the other hand, the first wiring via V1 penetrates through a plurality of layers, and may thus have the height greater than the height of each of the second and third wiring vias V2 and V3. In one example, the first wiring via V1 may penetrate through the interface between the second insulating layer 112 and the first insulating layer 111. The third wiring via V3 is additionally formed after the build-up process as in a process to be described later, and may have tapered side surfaces tapered in an opposite direction to the direction of the respective first and second wiring vias V1 and V2. The electronic component 200 may be a chip-type electronic component, for example, a chip-type passive component in which an internal electrode is disposed inside an insulating body and an external electrode 210 is disposed on an outside of the insulating body. The first and second wiring vias V1 and V2 may be connected to the external electrode 210 of the electronic component 200.

At least a portion of the first wiring layer 121 may include an embedded pattern 121E embedded in the first insulating layer 111 with respect to the upper surface of the first insulating layer 111, and may include a first protruding pattern 121P1 protruding on the upper surface of the first insulating layer 111 and in contact with the embedded pattern 121E. The first wiring layer 121 may further include a second protruding pattern 121P2 which is in another at least part of the first wiring layer 121 and which protrudes on the upper surface of the first insulating layer 111 and is spaced apart from the embedded pattern 121E. The embedded pattern 121E and the first protruding pattern 121P1 may contact each other to form a wiring pattern. The second protruding pattern 121P2 may be disposed on an upper side of the electronic component 200 so that at least a portion thereof and the electronic component 200 overlap each other on a plane. In this manner, by further forming, on the embedded pattern 121E, the first protruding pattern 121P1 in contact with the embedded pattern 121E, a wiring pattern having substantially the same level as the second protruding pattern 121P2 may be provided. In this case, it may be advantageous to form an opening of the first passivation layer 310, and defects in a process of forming the first electrical connection metal 315 or a process of flip chip bonding of the semiconductor chip 400 may be reduced.

The embedded pattern 121E of the first wiring layer 121 may be recessed to have a step difference from the upper surface of the first insulating layer 111. The recessed area may be filled with the first protruding pattern 121P1 in contact with the embedded pattern 121E, and as a result, the adhesion therebetween may be further improved. To provide the recessed area, the embedded pattern 121E may include a metal layer m without a seed layer. For example, the embedded pattern 121E may include only the metal layer m having a step while the seed layer is removed. On the other hand, the first protruding pattern 121P1 may include a plurality of conductor layers including a seed layer s and a metal layer m disposed on the seed layer s. Similarly, the second protruding pattern 121P2 may also include a plurality of conductor layers.

Hereinafter, respective configurations included in the printed circuit board 500A according to an example will be described in more detail with reference to the drawings.

An insulating material may be used as a material for the plurality of insulating layers 111, 112, 113, 114 and 115, and as the insulating material, a thermosetting resin such as epoxy resin, a thermoplastic resin such as polyimide, or a material in which an inorganic filler such as silica and/or a reinforcing material such as glass fiber are contained in these resins may be used. For example, as a material of the first insulating layer 111, a material including an insulating resin and an inorganic filler without glass fibers, for example, ABF may be used. In addition, as a material of the second to fifth insulating layers 112, 113, 114 and 115, a material including an insulating resin and an inorganic filler together with glass fibers, for example, a prepreg may be used. The number of the third to fifth insulating layers 113, 114 and 115 is not particularly limited, and may be smaller or greater than that depicted in the drawings.

A metal material may be used as a material of the plurality of wiring layers 121, 122, 123, 124 and 125, and as the metal material, copper (Cu), aluminum (Al), silver (Ag), tin (Sn), gold (Au), nickel (Ni), lead (Pb), titanium (Ti), or alloys thereof may be used. The plurality of wiring layers 121, 122, 123, 124 and 125 may respectively perform various functions depending on a design, and for example, may include a ground pattern, a power pattern, a signal pattern, and the like. In this case, the signal pattern includes various signals, for example, data signals and the like, excluding the ground pattern and the power pattern. Each of these patterns may have a line, a plane, or a pad shape. The number of the third to fifth wiring layers 123, 124 and 125 is not particularly limited, and may be smaller or greater than in the drawings.

The embedded pattern 121E of the first wiring layer 121 may be formed by a plating process using an Embedded Trace Substrate (ETS) method, and as a result, may include only the metal layer m without a seed layer. The first and second protruding patterns 121P1 and 121P2 of the first wiring layer 121 may be formed by a plating process such as an additive process (AP), a semi-AP (SAP), a modified SAP (MSAP), a tenting (TT) or the like, and as a result, may each include a seed layer (s), which is an electroless plating layer, and a metal layer (m), which is an electrolytic plating layer formed on the basis of the seed layer (s). Similarly, the second to fifth wiring layers 122, 123, 124 and 125 may also be formed by a plating process such as AP, SAP, MSAP or TT, and as a result, may each include a seed layer (s) and a metal layer (m). If necessary, a specific layer may further include a primer copper foil.

As materials for the plurality of wiring via layers V1, V2, V3, V4, V5 and V6, a metal material such as copper (Cu), aluminum (Al), silver (Ag), tin (Sn), gold (Au), nickel (Ni), lead (Pb), titanium (Ti), or alloys thereof may be used. The plurality of wiring via layers V1, V2, V3, V4, V5 and V6 may include signal connection vias, ground connection vias, power connection vias, and the like depending on a design. Each of the plurality of wiring via layers V1, V2, V3, V4, V5 and V6 may be entirely filled with a metal material, or may be formed as the metal material is formed along a wall surface of a via hole. The first, second, and fourth to sixth wiring vias V1, V2, V4, V5 and V6 may have a tapered shape in which the width of the lower surface is greater than the width of the upper surface, and the third wiring via V3 may have a tapered shape in which, conversely, the width of the upper surface is greater than the width of the lower surface. The plurality of wiring via layers V1, V2, V3, V4, V5 and V6 may also be formed by a plating process such as AP, SAP, MSAP or TT, and as a result, may respectively include the seed layer (s) and the metal layer (m).

The electronic component 200 may be a known active device and/or passive device. As the electronic component 200, a plurality of active devices and/or passive devices that are the same or different from each other may be disposed. As the active device, a well-known chip-type integrated circuit (IC) may be used. As the passive device, a known chip-type passive component may be used. As chip-type passive components, high-frequency inductors, ferrite inductors, power inductors, ferrite beads, LTCC, EMI filters, and MLCCs may be used, and chip-type capacitors such as MLCC may be used to improve power integrity characteristics.

The first passivation layer 310 may be disposed on the upper surface of the first insulating layer 111. The first passivation layer 310 may cover at least a portion of the first wiring layer 121 and may have a first opening exposing another at least part of the first wiring layer 121. The second passivation layer 320 may be disposed on the lower surface of the fifth insulating layer 115. The second passivation layer 320 may cover at least part of the fifth wiring layer 125 and may have a second opening exposing another at least part of the fifth wiring layer 125. The first and second passivation layers 310 and 320 may protect internal components of the printed circuit board 500A from external physical and chemical damage. The material of the first and second passivation layers 310 and 320 may be an insulating material. In this case, the insulating material may be a thermosetting resin such as an epoxy resin, a thermoplastic resin such as polyimide, or a mixture of these resins with an inorganic filler, for example, ABF, may be used, but is not limited thereto. For example, Solder Resist (SR) including a photoimageable material may also be used.

The first electrical connection metal 315 may be disposed on the first opening of the first passivation layer 310 to be connected to the first wiring layer 121. The second electrical connection metal 325 may be disposed on the second opening of the second passivation layer 320 to be connected to the fifth wiring layer 125. The first and second electrical connection metals 315 and 325 may provide a path for physically and/or electrically connecting the printed circuit board 500A to external components. The first and second electrical connection metals 315 and 325 may be formed of a low melting point metal having a lower melting point than copper (Cu), for example, tin (Sn) or an alloy containing tin (Sn). For example, the first and second electrical connection metals 315 and 325 may be respectively formed of solder, but are not limited thereto. The first and second electrical connection metals 315 and 325 may be lands, balls, pins, or the like, and may be formed as a multilayer or a single layer. When the first and second electrical connection metals 315 and 325 are formed as a multilayer structure, a copper pillar and solder may be included, and when formed as a single layer, a tin-silver solder may be included, but this is also only an example and is not limited thereto.

The semiconductor chip 400 may be a semiconductor chip in the form of an integrated circuit (IC) in which hundreds to millions of devices are integrated into a single chip. The semiconductor chip may be a logic chip or a memory chip. The logic chip may be a CPU, a GPU, or the like, or may be an AP including at least one of a CPU and a GPU, or may be an analog-to-digital converter, an ASIC, or the like, or may be a chip set including a specific combination of those listed above. The memory chip may be a memory such as DRAM, ROM, or flash, or a stack memory such as HBM or the like. In the case of the semiconductor chip 400, only one semiconductor chip may be disposed in a surface mount form, or a plurality of the same or different semiconductor chips may also be disposed side by side in a surface mounting form.

FIGS. 4 to 12 are cross-sectional views schematically illustrating an example of manufacturing the printed circuit board of FIG. 3.

Figure 4:
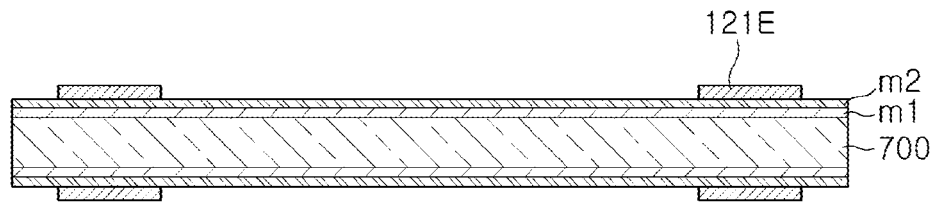
FIGS. 4 to 12 are cross-sectional views schematically illustrating an example of manufacturing the printed circuit board of FIG. 3.

Referring to FIG. 4, a carrier 700 having a plurality of metal foils m1 and m2 formed on both surfaces thereof is prepared. Then, an embedded pattern 121E is formed by a plating process using the outermost metal foil m2 as a seed layer.

Figure 5:
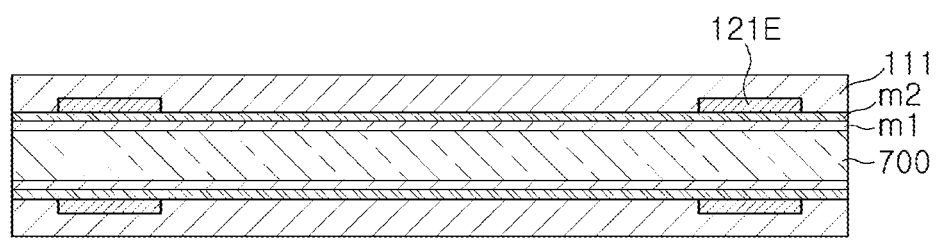

Referring to FIG. 5, the embedded pattern 121E is covered with a first insulating layer 111.

Figure 6:
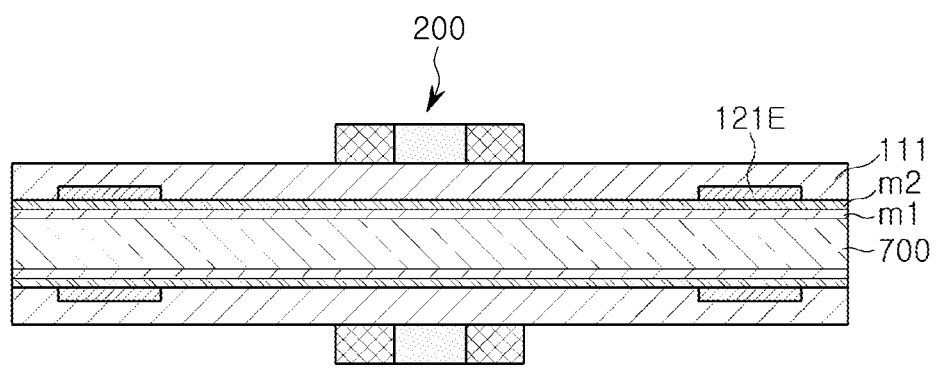

Referring to FIG. 6, an electronic component 200 is attached on the first insulating layer 111. The first insulating layer 121 may be used as an adhesive layer.

Figure 7:
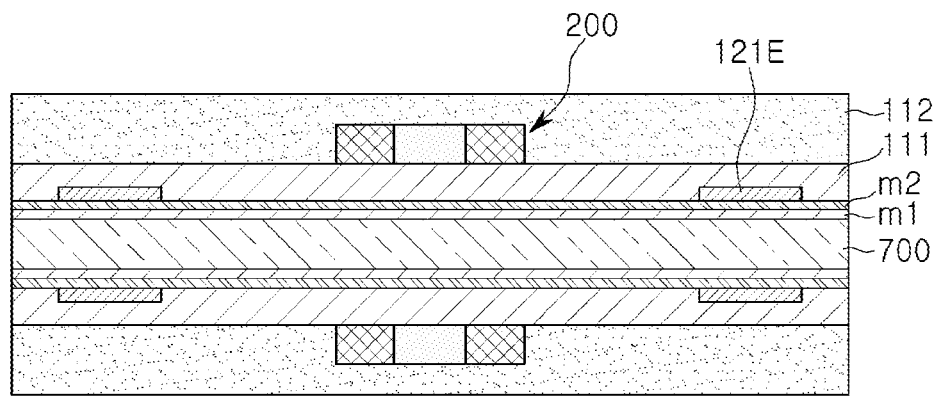

Referring to FIG. 7, the electronic component 200 is covered with a second insulating layer 112.

Figure 8:
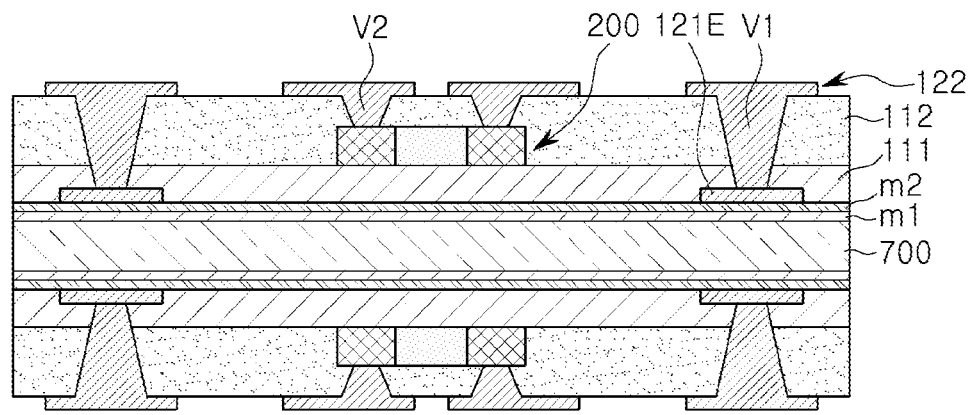

Referring to FIG. 8, after processing a via hole penetrating through the first and second insulating layers 111 and 112 and a via hole penetrating through the second insulating layer 112, the via holes are filled using the plating process, thereby forming first and second wiring vias V1 and V2, and in this case, a second wiring layer 122 is formed together therewith.

Figure 9:
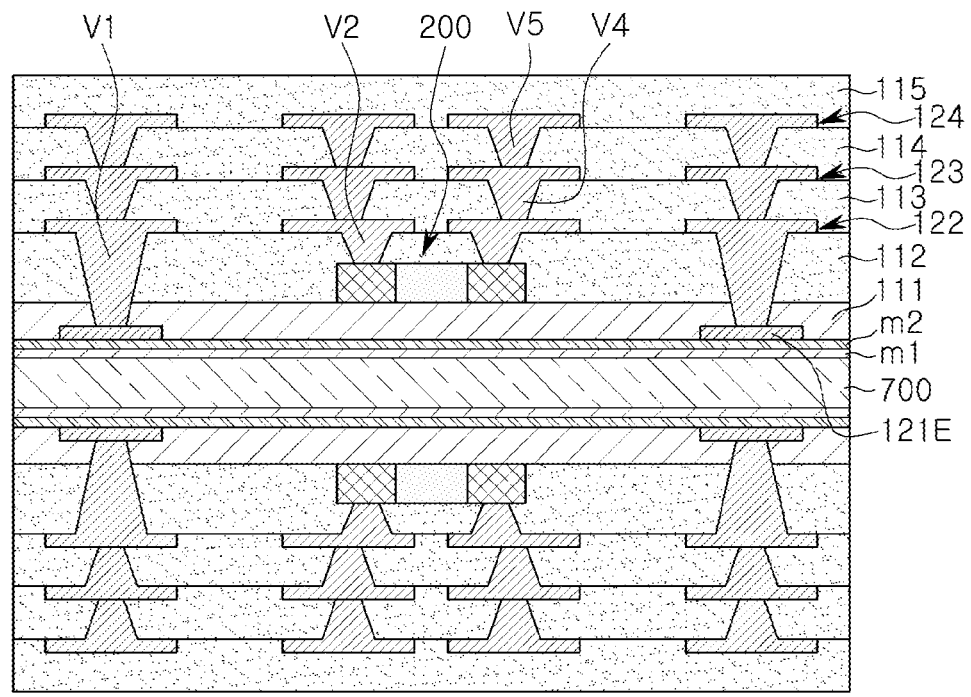

Referring to FIG. 9, third to fifth insulating layers 113, 114 and 115 are sequentially built up, and via holes are processed in the third and fourth insulating layers 113 and 114, respectively, and are then filled in a plating process, thereby forming fourth and fifth wiring vias V4 and V5, and in this case, third and fourth wiring layers 123 and 124 are formed together therewith.

Figure 10:
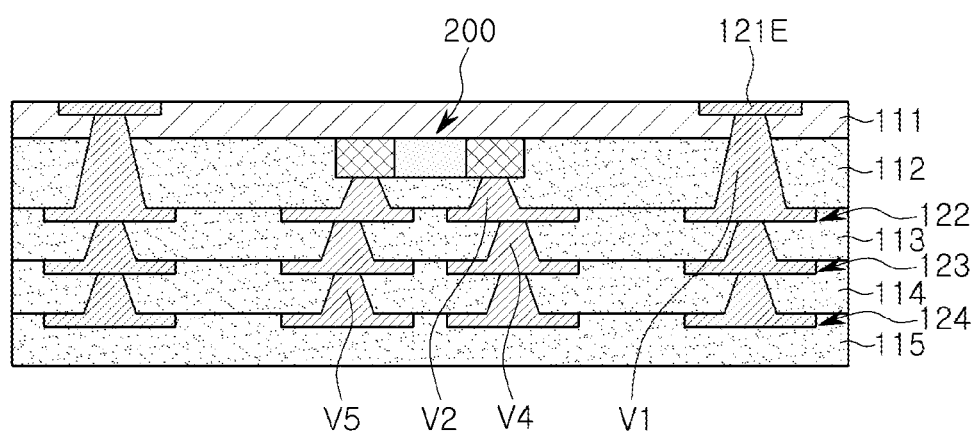

Referring to FIG. 10, as a method of separating the plurality of metal foils m1 and m2, a manufactured laminate is separated from the carrier 700. A release layer is disposed between the plurality of metal foils m1 and m2 to facilitate separation. After that, the metal foil m1 remaining on the laminate is removed by etching or the like. Therefore, the embedded pattern 121E may not have a seed layer in the final structure. In this process, the above-described recessed area may be formed.

Figure 11:
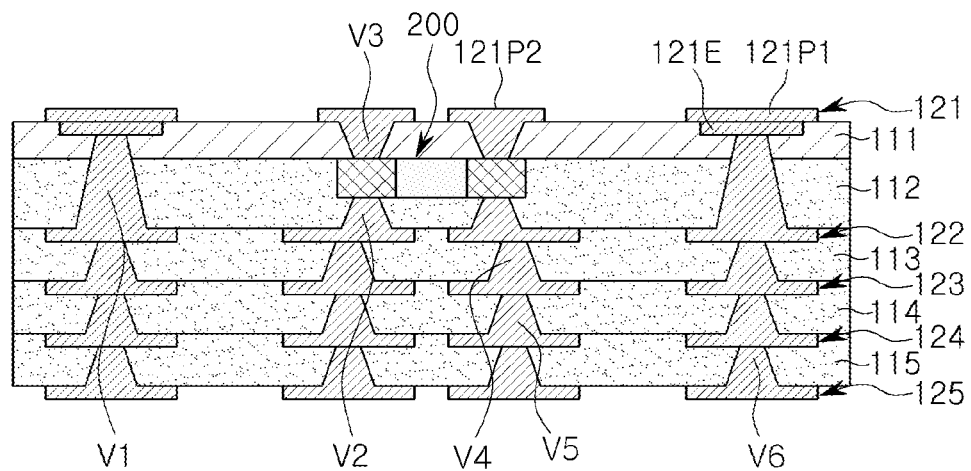

Referring to FIG. 11, a via hole is processed in the first insulating layer 111 and then filled using a plating process to form a third wiring via V3, and first and second protruding patterns 121P1 and 121P2 are formed together. Thus, the first wiring layer 121 is formed. In addition, a via hole is processed in the fifth insulating layer 115 and is then filled in a plating process to form a sixth wiring via V6, and a fifth wiring layer 125 is formed together.

Figure 12:
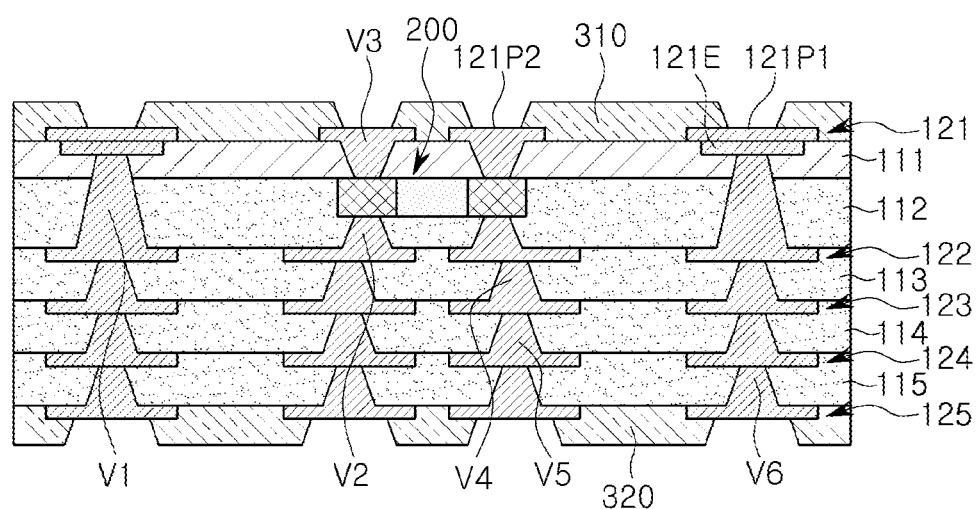

Referring to FIG. 12, a first passivation layer 310 is laminated on the first insulating layer 111. In addition, a second passivation layer 320 is laminated on the fifth insulating layer 115. In addition, first and second openings are formed in the first and second passivation layers 310 and 320, respectively.

The printed circuit board 500A according to the example described above may be manufactured through a series of processes, and other details are the same as described above, and detailed descriptions thereof will be omitted.

Figure 13:
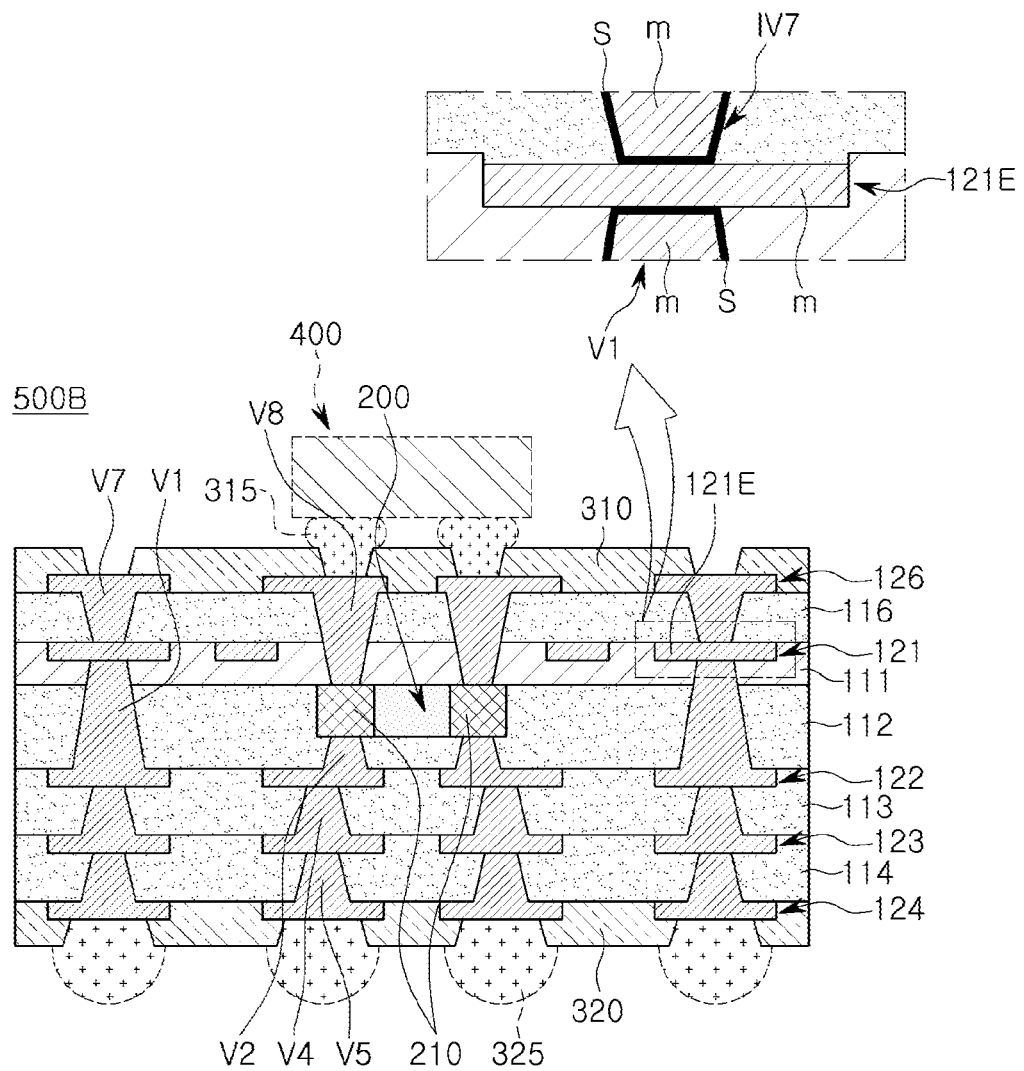
FIG. 13 is a schematic cross-sectional view of another example of a printed circuit board.

FIG. 13 is a schematic cross-sectional view of another example of a printed circuit board.

Referring to the drawings, a printed circuit board 500B according to another example may further include, in the printed circuit board 500A according to the above-described example, a sixth insulating layer 116 disposed on the upper surface of the first insulating layer 111, a sixth wiring layer 126 disposed on the upper surface of the sixth insulating layer 116, a seventh wiring via V7 penetrating through the sixth insulating layer 116 and connecting at least portions of the first and sixth wiring layers 121 and 126 to each other, and an eighth wiring via V8 collectively penetrating through the first and sixth insulating layers 111 and 116 and connecting at least portions of the electronic component 200 and the sixth wiring layer 126 to each other. In another example, since the first wiring layer 121 is not the outermost wiring layer, the embedded pattern 121E is included, but the protruding pattern is not included. On the other hand, in another example, the above-described fifth insulating layer 115, fifth wiring layer 125, and sixth wiring via V6 are omitted, and as a result, the second passivation layer 320 is disposed on the fourth insulating layer 114, but the configuration is not limited thereto. For example, the above-described configurations may not be omitted.

As the material of the sixth insulating layer 116, similarly to the second to fourth insulating layers 112, 113 and 114, a material including an insulating resin and an inorganic filler together with glass fibers, for example, a prepreg, may be used. The sixth wiring layer 126 may include a metal material as a material thereof, and may include a seed layer (s) and a metal layer (m). The sixth wiring layer 126 may include a ground pattern, a power pattern, a signal pattern, and the like, and each pattern may have a line, plane or pad shape. The seventh and eighth wiring vias V7 and V8 may also include a metal material as a material thereof, and may include a seed layer (s) and a metal layer (m). The seventh and eighth wiring vias V7 and V8 may respectively include a signal connection via, a ground connection via, a power connection via, or the like. Each of the seventh and eighth wiring vias V7 and V8 may be entirely filled with a metal material, or may also be formed as a metal material is formed along a wall surface of the via hole. Each of the seventh and eighth wiring vias V7 and V8 may have a tapered shape in which a width of an upper surface is greater than a width of a lower surface. The eighth wiring via V8 may have a height greater than that of the seventh wiring via V7.

Other details are substantially the same as described above, and detailed descriptions thereof will be omitted.

Figure 14:
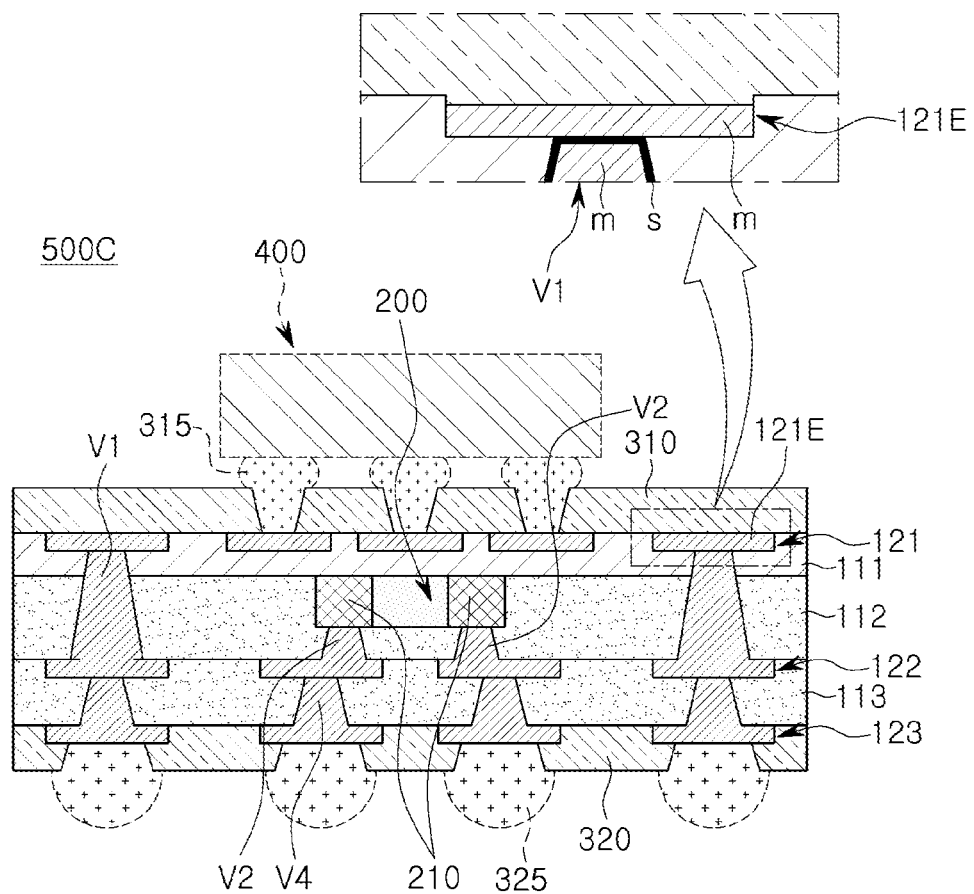
FIG. 14 is a schematic cross-sectional view of another example of a printed circuit board.

FIG. 14 is a schematic cross-sectional view of another example of a printed circuit board.

Referring to the drawings, in a printed circuit board 500C according to another example, the first wiring layer 121 includes the embedded pattern 121E, but does not include the protruding pattern, as compared with those in the printed circuit board 500A according to the above-described example. In detail, the first wiring layer 121 is configured with the embedded pattern 121E without a protruding pattern, and thus, at least a portion of the embedded pattern 121E is disposed on an upper side of the electronic component 200 to at least partially overlap the electronic component 200 on a plane. In addition, the above-described third wiring via V3 connecting the first wiring layer 121 and the electronic component 200 is omitted, and the first wiring layer 121 and the electronic component 200 may be electrically connected through a path passing through the first wiring via V1, the second wiring layer 122 and the second wiring via V2. On the other hand, in another example, the above-described fourth and fifth insulating layers 114 and 115, fourth and fifth wiring layers 124 and 125, and fifth and sixth wiring vias V5 and V6 are omitted, and as a result, the second passivation layer 320 is disposed on the third insulating layer 113, but the configuration is not limited thereto. For example, the above configurations may not be omitted.

Other details are substantially the same as described above, and detailed descriptions thereof will be omitted.

As set forth above, according to an exemplary embodiment, a printed circuit board, which may be more easily implemented as multiple layers and in which an electronic component may be embedded, may be provided.

A printed circuit board in which power integrity characteristics may be improved is provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A printed circuit board comprising:
   a first insulating layer;
   a second insulating layer disposed on a lower surface of the first insulating layer, the first and second insulating layers including an interface therebetween;
   an electronic component embedded in the second insulating layer, an upper surface of the electronic component being at least partially in contact with the first insulating layer, each of side and lower surfaces of the electronic component being at least partially in contact with the second insulating layer;
   a first wiring layer disposed on an upper surface of the first insulating layer;
   a second wiring layer disposed on a lower outer surface of the second insulating layer; and
   a first wiring via, which is a single via layer, penetrating through the first and second insulating layers and directly contacting at least portions of the first and second wiring layers without any intervening conductive material, wherein lower and upper sides of the electronic component are connected to the second wiring layer and the first wiring layer through a second wiring via and a third wiring via, respectively, the second wiring via penetrates the second insulating layer and the third wiring via penetrates the first insulating layer, wherein at least a portion of the first wiring layer comprises an embedded pattern that is embedded in an interior of the first insulating layer, based on the upper surface of the first insulating layer, and a first protruding pattern protruding on the upper surface of the first insulating layer and in contact with the embedded pattern, wherein the embedded pattern is disposed in an area that does not overlap the electronic component and is not disposed in an area that overlaps the electronic component, and wherein the embedded pattern and the first protruding pattern include an interface therebetween.

2. The printed circuit board of claim 1, wherein the first and second insulating layers comprise different materials.

3. The printed circuit board of claim 2, wherein the first insulating layer comprises an insulating resin and an inorganic filler without glass fiber, and
the second insulating layer comprises an insulating resin, an inorganic filler, and glass fiber.

4. The printed circuit board of claim 1, wherein the second wiring via penetrates through the second insulating layer and connects at least portions of the electronic component and the second wiring layer to each other,
wherein the first wiring via has a height greater than a height of the second wiring via.

5. The printed circuit board of claim 4, wherein the third wiring via penetrates through the first insulating layer and connects at least other portions of the electronic component and the first wiring layer to each other,
wherein the second and third wiring vias have side surfaces tapered in opposite directions to each other.

6. The printed circuit board of claim 1, wherein an upper surface of the embedded pattern is recessed to have a step difference from the upper surface of the first insulating layer.

7. The printed circuit board of claim 1, wherein at least a portion of the embedded pattern is disposed on an upper side of the electronic component to at least partially overlap the electronic component on a plane.

8. The printed circuit board of claim 1, wherein another at least part of the first wiring layer comprises a second protruding pattern protruding on the upper surface of the first insulating layer and spaced apart from the embedded pattern,
wherein at least a portion of the second protruding pattern is disposed on an upper side of the electronic component to at least partially overlap the electronic component on a plane.

9. The printed circuit board of claim 1, further comprising:
a third insulating layer disposed on the upper surface of the first insulating layer;
a third wiring layer disposed on an upper surface of the third insulating layer;
a fourth wiring via penetrating through the third insulating layer and connecting at least portions of the first and third wiring layers to each other; and
a fifth wiring via penetrating through the first and third insulating layers and connecting at least portions of the electronic component and the third wiring layer to each other,
wherein the first and fourth wiring vias have side surfaces tapered in opposite directions, and
the fifth wiring via has a height greater than a height of the fourth wiring via.

10. The printed circuit board of claim 1, further comprising:
a fourth insulating layer disposed on the lower surface of the second insulating layer;
a fourth wiring layer disposed on a lower surface of the fourth insulating layer; and
a sixth wiring via penetrating through the fourth insulating layer and connecting at least portions of the second and fourth wiring layers to each other.

11. The printed circuit board of claim 1, wherein the electronic component includes a chip-type passive component including an insulating body, an internal electrode disposed in an interior of the insulating body, and an external electrode disposed on an outer portion of the insulating body.

12. A printed circuit board comprising:
an insulating body including a plurality of insulating layers;
a plurality of wiring layers respectively disposed on or in the insulating body;
a plurality of wiring via layers respectively disposed in the insulating body, and connecting the plurality of wiring layers to each other; and
an electronic component disposed in the insulating body, disposed on a level between two adjacent wiring layers among the plurality of wiring layers, and disposed on an interface between two adjacent insulating layers among the plurality of insulating layers, the two adjacent insulating layers including the interface therebetween,
wherein the electronic component has an upper surface at least partially in contact with one of the two adjacent insulating layers, and side and lower surfaces at least partially in contact with the other one of the two adjacent insulating layers,
wherein one wiring via layer, which is a single via layer, directly contacting the two adjacent wiring layers without any intervening conductive material, among the plurality of wiring via layers, penetrates through at least two insulating layers among the plurality of insulating layers,
wherein upper and lower sides of the electronic component are connected to the two adjacent wiring layers through wiring vias, respectively,
wherein an upper wiring layer among the two adjacent wiring layers comprises an embedded pattern that is embedded in an interior of the insulating body, based on an upper surface of the insulating body, a first protruding pattern protruding on the upper surface of the insulating body and in contact with the embedded pattern, and a second protruding pattern protruding on the upper surface of the insulating body and spaced apart from the embedded pattern, and
wherein a width of the embedded pattern is smaller than that of the first protruding pattern.

13. The printed circuit board of claim 12, further comprising:
a first passivation layer disposed on an upper side of the insulating body and covering at least a portion of an uppermost wiring layer among the plurality of wiring layers; and a second passivation layer disposed below the insulating body and covering at least a portion of a lowermost wiring layer among the plurality of wiring layers.

14. The printed circuit board of claim 13, further comprising a semiconductor chip disposed on the first passivation layer and connected to the electronic component.

15. A printed circuit board comprising:
a plurality of insulating layers;
an electronic component disposed on an interface between two adjacent insulating layers among the plurality of insulating layers, the two adjacent insulating layers including different materials from each other; and
a plurality of wiring layers respectively disposed on or embedded in the plurality of insulating layers; and
a via passing through the interface,
wherein the electronic component has an upper surface at least partially in contact with one of the two adjacent insulating layers, and side and lower surfaces at least partially in contact with the other one of the two adjacent insulating layers,
wherein each of the plurality of wiring layers is spaced apart from the interface,
wherein the electronic component is entirely embedded in one of the two adjacent insulating layers, the one of the two adjacent insulating layers being a single layer,
wherein the via penetrates through the two adjacent insulating layers to directly contact two adjacent wiring layers among the plurality of wiring layers without any intervening conductive material,
wherein the via is a single via layer,
wherein an uppermost wiring layer among the plurality of wiring layers comprises an embedded pattern that is embedded in an interior of an uppermost insulating layer among the plurality of insulating layers, based on an upper surface of the uppermost insulating layer, a first protruding pattern protruding on the upper surface of the uppermost insulating layer and in contact with the embedded pattern, and a second protruding pattern protruding on the upper surface of the uppermost insulating layer and spaced apart from the embedded pattern, and
wherein a side surface of the embedded pattern and a side surface of the first protruding pattern have a step portion therebetween.

* * * * *